United States Patent
Shields

(10) Patent No.: US 6,440,874 B1
(45) Date of Patent: Aug. 27, 2002

(54) HIGH THROUGHPUT PLASMA RESIST STRIP PROCESS FOR TEMPERATURE SENSITIVE APPLICATIONS

(75) Inventor: Jeffrey A. Shields, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/534,000

(22) Filed: Mar. 24, 2000

(51) Int. Cl.$^7$ .................. H01L 21/31; H01L 21/302; H01L 21/461

(52) U.S. Cl. .................. 438/758; 438/725; 438/743; 438/723; 438/963

(58) Field of Search ................. 438/758, 725, 438/714, 903, 963, 704, 696, 723, 734, 740, 720, 727, 743, 724, 744

(56) References Cited

U.S. PATENT DOCUMENTS

| | | | |
|---|---|---|---|
| 4,983,254 A | * 1/1991 | Fujimura et al. | 156/643 |
| 5,693,147 A | * 12/1997 | Ward et al. | 134/1.1 |
| 5,770,523 A | * 6/1998 | Hung et al. | 438/725 |
| 5,773,201 A | * 6/1998 | Fujimura et al. | 430/329 |
| 5,817,579 A | * 10/1998 | Ko et al. | 438/740 |
| 6,080,680 A | * 6/2000 | Lee et al. | 438/727 |

\* cited by examiner

Primary Examiner—Matthew Smith
Assistant Examiner—Igwe U. Anya
(74) Attorney, Agent, or Firm—McDermott, Will & Emery

(57) ABSTRACT

The invention relates to the field of manufacturing semiconductor devices, particularly processes directed to resist removal. In the method of the invention, the wafer temperature is maintained below approximately 210° C. to 220° C. to prevent residue formation, by controlling the temperature of a platen or paddle adjacent a wafer to be less than about 210° C. throughout plasma stripping of a resist layer disposed on the wafer. Moreover, to achieve a suitable yield and throughput at these temperatures, the flow rate of an additive to gases supplied to a plasma chamber to create an $O_2$ plasma is controlled to thereby control and improve a resist striprate at these temperatures.

13 Claims, 2 Drawing Sheets

HIGH THROUGHPUT PLASMA RESIST STRIP PROCESS FOR TEMPERATURE SENSITIVE APPLICATIONS

FIELD OF THE INVENTION

The present invention relates to the field of manufacturing semiconductor devices with patterned metal interconnections, and more particularly, to manufacturing high density semiconductor devices with submicron patterned metal features for local and global interconnections.

BACKGROUND OF THE INVENTION

Current demands for high density and performance associated with ultra large scale integration require submicron features of about 0.25 microns and under, increased transistor and circuit speeds and improved reliability. Such demands for increased density, performance and reliability require device features manufactured with high precision and uniformity.

Conventional semiconductor devices comprise a substrate and various electrically isolated regions, called active regions, in which individual circuit components, such as transistors comprising gates and source/drain regions, are formed and interconnected. In one interconnection scheme, shown in FIGS. 1(a) and 1(b), source/drain regions 3 and gates 4 of neighboring transistors are connected to one another by local interconnections 5 to form "standard cells" which, in turn, are connected to each other locally and globally by several patterned metal layers (e.g. 8) interleaved with insulating layers (e.g. 7) formed above and extending substantially horizontally with respect to the substrate 1 surface. The metal layers (e.g. 8) are connected to one another and to the local interconnection 5 by vias (e.g., contacts 6).

Conventional practices employ aluminum alloys for interconnects, with various metals, such as copper, added for electromigration improvement. One conventional interconnect scheme, shown in FIG. 1(a), comprises depositing a composite three-layer metal stack 8 comprising an upper layer 8c of titanium nitride (TiN) or titanium-titanium nitride (Ti—TiN), an intermediate layer 8b of aluminum (Al) or Al alloy and a lower layer 8a of titanium (Ti) or Ti—TiN, as by sputtering.

A patterned photoresist mask 9 is then formed on the metal layer 8 defining a metal pattern and the underlying metal is etched through the mask 9 to form the pattern of metal lines 8. The quality of the photoresist mask 9 is crucial to the definition of the metal interconnect layer and, ultimately, to device performance. Thus, if defects are observed or detected in the mask, it must be removed and replaced (i.e., reworked) with a defect free mask before etching. A successful resist mask rework completely removes all of the resist 9 without damaging the underlying substrate material, increasing the defect density, or introducing systematic yield variations.

Conventional photoresist mask removal techniques include pumping down the pressure in a plasma chamber after the wafer has been placed on a heated platen and stripping the wafer, such as by oxygen plasma stripping, while the wafer temperature is substantially at the platen temperature of 240° C. to 260° C. The stripping process is typically followed by solvent cleaning. A new patterned photoresist mask is then formed on the underlying metal layer and etching is conducted to form the patterned metal lines. However, wafers processed by these conventional techniques exhibit an abnormally high defect density after the subsequent metal etch process, due to formation of a residue (R). This residue (R), illustrated in FIG. 1(b), causes bridging between adjacent lines and, hence, short-circuiting and device failure.

Investigation by the inventors revealed that residue (R) was formed as a result of precipitates from an alloy solution, influenced by the temperature and duration of the rework. In one exemplary configuration, copper (Cu) precipitated out of an Aluminum-Copper (Al/1%Cu) alloy at a wafer temperature of about 240° C. (roughly corresponding to a platen temperature of about 240° C.), leading to residue formation and bridging. It was determined that the residue (R) increased as the concentration of the copper in the AlCu alloy was increased and the residue was found to increase and decrease with increases and decreases in the temperature and duration of the rework.

Generally, a method is needed to permit efficient limitation of wafer temperature during processing to prevent formation of the aforementioned precipitates. More specifically, there is a need for a method enabling replacement of a defective resist mask without the aforementioned bridging yield losses and without collaterally compromising throughput or yield. These needs are particularly acute in manufacturing high density devices having minimal interwiring spaces.

SUMMARY OF THE INVENTION

The inventors determined that the wafer temperature should be maintained below approximately 210° C. to 220° C. to prevent residue formation, contrary to conventional plasma strip operations which seek to raise the wafer temperature as high as possible to increase the striprate. One approach to limiting wafer temperature is simply to lower the platen temperature or paddle temperature in the plasma strip chamber. However, the plasma striprate is strongly dependent on the temperature and decreases with decreasing temperature. Thus, merely lowering the platen temperature decreases the striprate and throughput to an undesirable extent.

According to the invention, the earlier stated needs are met in part by a method for manufacturing a semiconductor device including controlling the temperature of a platen or paddle adjacent a wafer to be less than about 210° C. The flow rate of an additive to the reactant gases used to create an $O_2$ plasma is controlled to thereby control the resist striprate. A resist layer disposed on the wafer is plasma stripped while maintaining the temperature of the platen or paddle below about 210° C. throughout the stripping of the resist layer. Controlling the temperature of the platen or paddle in this manner maintains the wafer temperature below approximately 210° C. during the plasma stripping process in accord with the above aspects of the invention and prevents residue (R) formation improving product yield. Controlling the flow rate of the additive to the reactant gases that form the $O_2$ plasma allows a desired striprate to be achieved at temperatures below about 210° C.

Additional features and advantages of the present invention will become readily apparent to those skilled in the art from the following detailed description, wherein only preferred embodiments of the invention are shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein.

DESCRIPTION OF THE INVENTION

The invention addresses and solves problems stemming from the replacement of a defective resist mask on a metal layer with a substantially non-defective resist mask. Specifically, the invention addresses problems associated with removal of a defective resist mask from a metal layer and substantially eliminates formation of residue or precipitate by maintaining the wafer temperature below a prescribed temperature. Thus, "bridging", short-circuiting and device failure caused by the residue is substantially prevented.

Figure 1A:
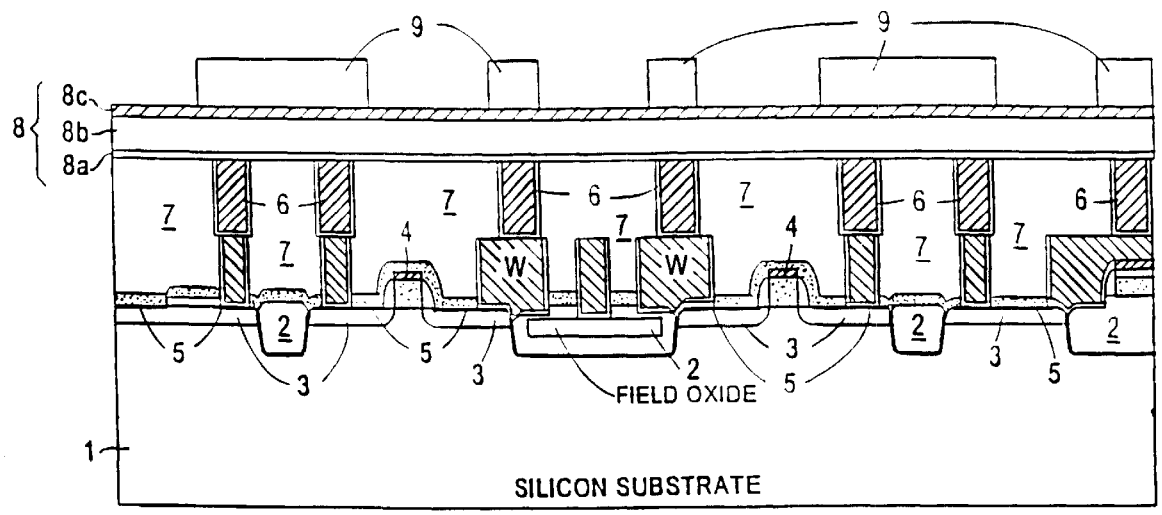
FIGS. 1(a)–(b) show the results of a conventional photoresist mask removal technique wherein a residue R is formed following etching.
Figure 1B:
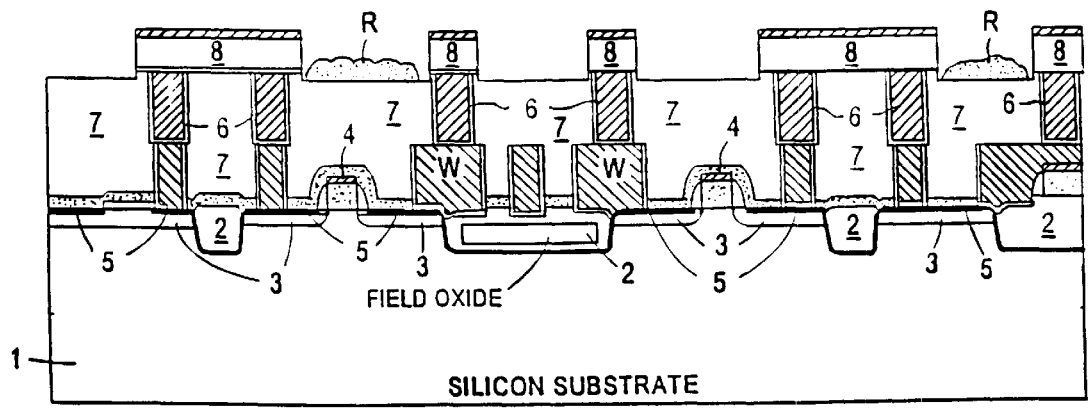
Figure 2:
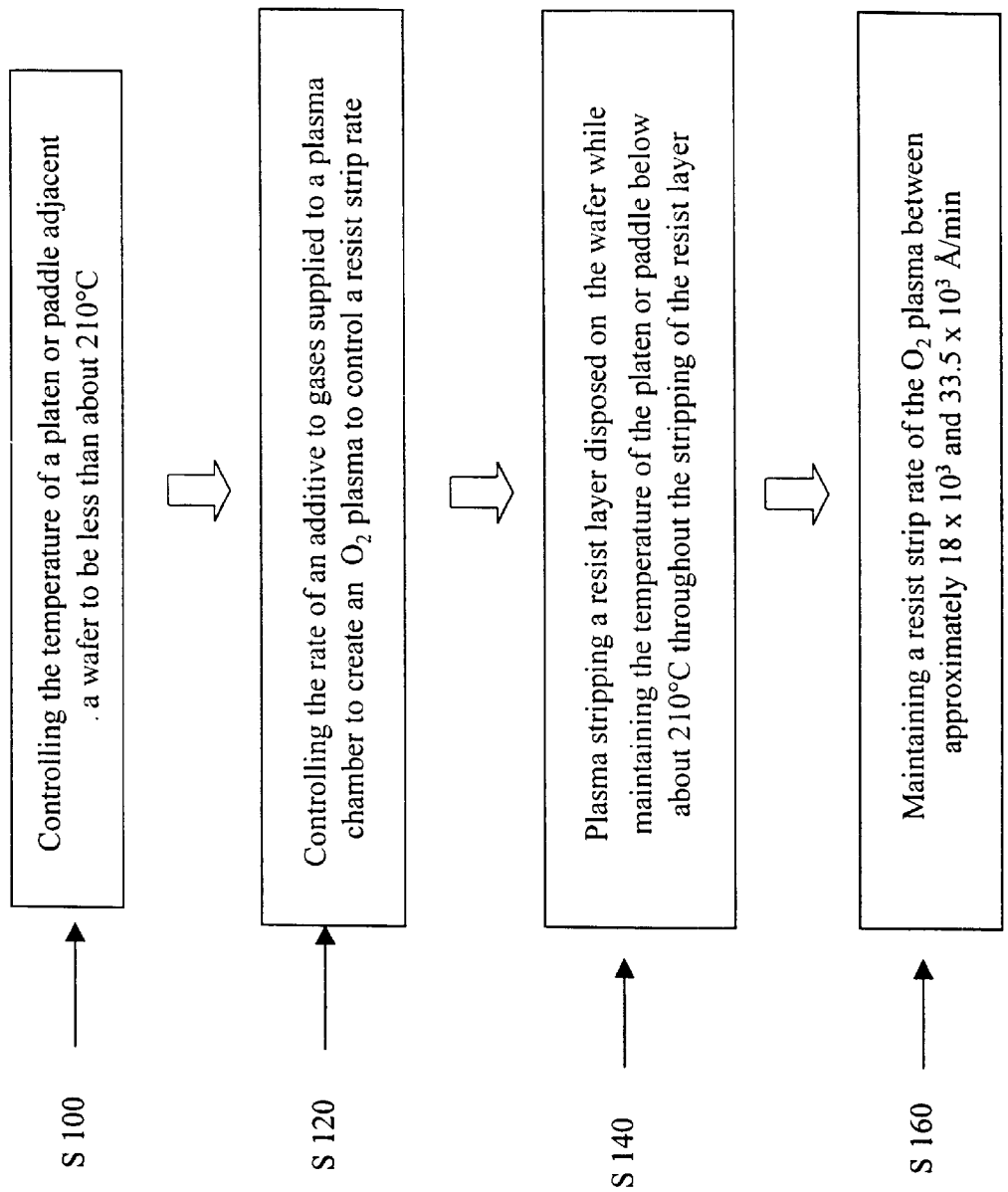
FIG. 2 shows a process diagram of an embodiment of the present invention.

FIG. 2 shows a flowchart of one preferred embodiment of a method for manufacturing a semiconductor device. In STEP 100, this embodiment includes controlling the temperature of a platen or paddle adjacent a wafer to be less than about 210° C. Controlling the temperature of a platen or paddle to be less than about 210° C. correspondingly maintains the wafer temperature below approximately 210° C. and residue (R) formation is prevented. Merely lowering the wafer temperature, however, reduced the strip rate to an undesirable level. The invention overcomes this limitation by providing an additive to the reactant gases that form an $O_2$ plasma.

In STEP 120, the flow rate of an additive to the reactant gases used to create an $O_2$ plasma is controlled to thereby control the resist striprate. In certain embodiments, the additive includes $CF_4$. The inventor determined that a small amount of $CF_4$ added to the reactant gases used to create an $O_2$ plasma produces a plasma striprate higher than the plasma striprate of an $O_2/H_2O$ plasma under substantially equivalent process parameters. In experiments conducted by the inventor, a total plasma flow rate of 680 standard cubic centimeters per minute (sccm) was used for the $O_2/H_2O/CF_4$ plasma. The $O_2$ flow rate was approximately 600 sccm, the $H_2O$ flow rate was approximately 60 sccm, and the additive (e.g., $CF_4$) flow rate was approximately 20 sccm or about 3% of the total flow rate.

In this experiment, the platen or paddle temperature was initially set at a typical process temperature of about 240° C. and the striprates of the $O_2/H_2O$ plasma was determined to be essentially the same as the $O_2/H_2O/CF_4$ plasma. Normalizing the striprate of the 240° C. $O_2/H_2O$ plasma relative to the striprate of the 240° C. $O_2/H_2O/CF_4$ plasma resulted in a normalized striprate of 100% for the 240° C. $O_2/H_2O$ plasma and 101% for the 240° C. $O_2/H_2O/CF_4$ plasma.

At a platen or paddle temperature of 170° C., the striprate of the $O_2/H_2O$ plasma markedly decreased to approximately 44% (of the $O_2/H_2O$ plasma resist striprate at 240° C). In contrast, at the same 170° C. temperature, the resist striprate of the $O_2/H_2O/CF_4$ plasma decreased only slightly to 88% (of the $O_2/H_2O$ plasma resist striprate at 240° C.). Thus, at 170° C., according to the present invention the resist striprate of the $O_2/H_2O/CF_4$ plasma is twice that of the $O_2/H_2O$ plasma.

Likewise, when the temperature of the platen or paddle was decreased to 100° C., the resist striprate of the $O_2/H_2O$ plasma decreased to only 7% (of the $O_2/H_2O$ plasma resist striprate at 240° C.). In contrast, at the same 100° C. temperature, the resist striprate of the $O_2/H_2/CF_4$ plasma of the present invention only decreased to 61% (of the $O_2/H_2O$ plasma resist striprate at 240° C.). Thus, at 100° C., the resist striprate of the $O_2/H_2O/CF_4$ plasma is almost nine times greater than that of the $O_2/H_2O$ plasma.

Therefore, by controlling the flow rate of an additive to the reactant gases used to create an $O_2$ plasma in STEP 120, the resist striprate may be improved significantly, even at lower temperatures, thereby improving throughput at these lower temperatures. In addition, STEP 140 includes plasma stripping of a resist layer disposed on the wafer while maintaining the temperature of the platen or paddle below about 210° C. throughout the stripping of the resist layer. Controlling the temperature of a platen or paddle to be less than about 210° C. correspondingly maintains the wafer temperature below approximately 210° C. and substantially prevents residue (R) formation.

In accord with the above preferred embodiment, the plasma strip of a resist layer disposed on the wafer is performed while maintaining the temperature of the platen or paddle between approximately 100° C. and 210° C. As shown in FIG. 2, STEP 160 of this embodiment, using an $O_2$ plasma, wherein an additive such as $CF_4$ is added to the reactant gases used to create the plasma, maintains comprising $CF_4$ as the additive enables maintenance of a resist striprate of at least approximately $26 \times 10^3$ Angstroms per minute (Å/min) at a temperature of 170° C. Comparatively, use of an $O_2/H_2O$ plasma at this temperatures yields a resist striprate of approximately $13 \times 10^3$ Å/min. Likewise, at a temperature of 100° C., the resist striprate of the $O_2/H_2O$ plasma is only about $2 \times 10^3$ Å/min, whereas the method of the invention advantageously provides a striprate between approximately $18 \times 10^3$ Å/min and $22 \times 10^3$ Å/min. Thus, although a relatively higher strip rate is attained by performing the plasma strip process while maintaining the temperature of the platen or paddle between approximately 170° C. and 200° C., the present invention also advantageously increases striprates for temperatures between 100° C. and 210° C., and even below 100° C.

This method is particularly applicable in metal rework applications, where a resist is formed on a metal layer or a composite structure. Based on the inventors' investigation into the residue (R) formation phenomenon, it was determined that the residue was a result of precipitates from an alloy solution and it was determined that the residue formation could be substantially prevented by reducing the temperature of metal rework applications, such as the stripping of a resist disposed on a metal layer or composite structure including an aluminum alloy comprising about 1% copper, as used for example in interconnects.

One example of such an interconnect is a three-layer metal stack including a top layer of TiN, an intermediate layer of an Al alloy containing about 1% Cu, and a bottom layer of Ti, which, in turn, is typically formed on a dielectric layer. Upon observing or detecting that the resist is defective, the resist is substantially entirely removed prior to metal patterning according to the method of the present invention, thus substantially reducing or preventing formation of residue R by stripping the resist at low temperatures.

Thus, this method advantageously provides an efficient, cost-effective way to replace a defective resist, particularly from a metal layer. The method for manufacturing a semiconductor device according to the present invention is further characterized by the substantial absence of a residue between the metal layers. As a result, one advantage of the invention is that it advantageously reduces the amount of bridging in subsequently formed metal lines, thereby avoiding short circuiting and device failure. The invention is applicable to the manufacture of various semiconductor devices having patterned metal interconnections, particularly high density semiconductor devices.

The present invention can be practiced by employing conventional materials, methodology and equipment. In the previous descriptions, numerous specific details are set forth to provide a thorough understanding of the present invention, although explicit details of such materials, equipment and methodology are not set forth herein in detail so as not to unnecessarily obscure the present invention. However, it should be recognized that the present invention can be practiced without resorting to the details specifically set forth. Only the preferred embodiment of the present invention and but a few examples of its versatility are shown and described in the present disclosure and it is to be understood that the present invention is capable of use in other combinations and environments and contemplates modifications within the scope of the inventive concept expressed herein.

What is claimed is:

1. A method for manufacturing a semiconductor device, comprising:

controlling the temperature of a platen or paddle adjacent a wafer to be greater than 60° C. and less than 180° C.;

plasma stripping a resist layer disposed on the wafer;

maintaining the temperature of the platen or paddle greater than 60° C. and below 180° C. throughout the stripping of the resist layer; and controlling the flow rate of an additive to gases supplied to a plasma chamber to create an $O_2$ plasma to control a resist striprate;

wherein the additive consists of $CF_4$; and wherein the additive comprises about 3% of a total flow rate of gases supplied to a plasma chamber.

2. A method for manufacturing a semiconductor device according to claim 1, wherein the gases supplied to the plasma chamber further comprise $H_2O$.

3. A method for manufacturing a semiconductor device according to claim 1, wherein the additive flow rate is approximately 20 sccm.

4. A method for manufacturing a semiconductor device, comprising:

controlling the temperature of a platen or paddle adjacent a wafer to be less than about 210° C.;

plasma stripping a resist layer disposed on the wafer;

while maintaining the temperature of the platen or paddle below about 210° C. throughout the stripping of the resist layer;

controlling the flow rate of an additive to gases supplied to a plasma chamber to create an $O_2$ plasma to control a resist striprate, and wherein the additive consists of $CF_4$, wherein the additive comprises about 3% of a total flow rate of gases supplied to a plasma chamber, wherein the gases supplied to the plasma chamber further comprise $H_2O$, and wherein the $H_2O$ flow rate comprises about 10% of an $O_2$ flow rate wherein the $O_2$ flowrate is approximately 600 sccm.

5. A method for manufacturing a semiconductor device, comprising:

controlling the temperature of a platen or paddle adjacent a wafer to be greater than 60° C. and less than 180° C.;

plasma stripping a resist layer disposed on the wafer;

maintaining the temperature of the platen or paddle greater than 60° C. and below 180° C. throughout the stripping of the resist layer; and controlling the flow rate of an additive to gases supplied to a plasma chamber to create an $O_2$ plasma to control a resist striprate;

wherein the additive consists of $CF_4$; and wherein the resist layer is disposed over a metal layer.

6. A method for manufacturing a semiconductor device according to claim 5, wherein the metal layer is a composite structure comprising a layer of an aluminum alloy.

7. A method for manufacturing a semiconductor device according to claim 6, wherein the aluminum alloy comprises 1% copper.

8. A method of stripping a resist from a semiconductor wafer, comprising:

controlling the temperature of a platen or paddle adjacent a wafer to be less than 180° C.;

plasma stripping a resist layer disposed on the wafer;

maintaining the temperature of the platen or paddle below 180° C. throughout the stripping of the resist layer;

controlling the flow rate of $CF_4$ to gases supplied to a plasma chamber to create an $O_2$ plasma to control a resist striprate at low temperatures; and maintaining a striprate greater than approximately $18 \times 10^3$ Å/min, and wherein the $CF_4$ flow rate comprises about 3% of a total flow rate of the gases supplied to the plasma chamber to create the $O_2$ plasma.

9. A method of stripping a resist from a semiconductor wafer according to claim 8, wherein the total flow rate of the gases is between approximately 650 and 750 sccm.

10. A method of stripping a resist from a semiconductor wafer according to claim 9, wherein the $CF_4$ flow rate is approximately 20 sccm.

11. A method of stripping a resist from a semiconductor wafer, comprising:

controlling the temperature of a platen or paddle adjacent a wafer to be less than 180° C.;

plasma stripping a resist layer disposed on the wafer;

maintaining the temperature of the platen or paddle below 180° C. throughout the stripping of the resist layer;

controlling the flow rate of $CF_4$ to gases supplied to a plasma chamber to create an $O_2$ plasma to control a resist striprate at low temperatures; and maintaining a striprate greater than approximately $18 \times 10^3$ Å/min, and wherein the resist layer is disposed over a metal layer.

12. A method for stripping a resist from a semiconductor wafer according to claim 11, wherein the metal layer is a composite structure comprising a layer of an aluminum alloy.

13. A method for stripping a resist from a semiconductor wafer according to claim 12, wherein the aluminum alloy comprise 1% copper.

* * * * *